(12) United States Patent
Muchherla et al.

(10) Patent No.: US 11,705,192 B2
(45) Date of Patent: Jul. 18, 2023

(54) MANAGING READ LEVEL VOLTAGE OFFSETS FOR LOW THRESHOLD VOLTAGE OFFSET BIN PLACEMENTS

(71) Applicant: Micron Technology, Inc., Boise, ID (US)

(72) Inventors: Kishore Kumar Muchherla, Fremont, CA (US); Mustafa N. Kaynak, San Diego, CA (US); Michael Sheperek, Longmont, CO (US); Shane Nowell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 77 days.

(21) Appl. No.: 17/124,144

(22) Filed: Dec. 16, 2020

(65) Prior Publication Data
US 2022/0189545 A1   Jun. 16, 2022

(51) Int. Cl.
  *G11C 16/26* (2006.01)
  *G11C 11/56* (2006.01)
  *G11C 16/04* (2006.01)

(52) U.S. Cl.
CPC ...... *G11C 11/5642* (2013.01); *G11C 11/5671* (2013.01); *G11C 16/0483* (2013.01); *G11C 16/26* (2013.01)

(58) Field of Classification Search
CPC .......................... G11C 16/0483; G11C 16/26
See application file for complete search history.

(56) References Cited

U.S. PATENT DOCUMENTS 9,236,147 B1 *  1/2016  Bellorado ............ G11C 29/028

* cited by examiner

*Primary Examiner* — Alfredo Bermudez Lozada
(74) *Attorney, Agent, or Firm* — Lowenstein Sandler LLP

(57) ABSTRACT

A block family associated with a memory device is created. The block family is associated with a threshold voltage offset bin. A set of read level voltage offsets is determined such that, applying the set of read level voltage offsets to a base read level threshold voltage associated with the block family, result in a suboptimal error rate not exceeding a maximum allowable error rate. The determined set of read level offsets is associated with the threshold voltage offset bin by updating a block family metadata.

20 Claims, 12 Drawing Sheets

| | | Set-N 1101 | | | | | | | |
|---|---|---|---|---|---|---|---|---|---|
| | | Bins 1103 | | | | | | | |
| | | 0 | 1 | 2 | 3 | 4 | 5 | 6 | 7 |
| Valleys | 1 | a | c | c | d | d | e | f | g |
| | 2 | b | d | e | f | g | h | i | j |
| | 3 | d | e | f | g | h | i | j | k |
| | 4 | l | m | n | o | p | q | r | s |
| | 5 | m | n | o | s | s | t | t | u |
| | 6 | u | u | v | w | w | x | y | y |
| | 7 | v | v | w | w | x | y | z | z |

MANAGING READ LEVEL VOLTAGE OFFSETS FOR LOW THRESHOLD VOLTAGE OFFSET BIN PLACEMENTS

TECHNICAL FIELD

Embodiments of the disclosure relate generally to memory sub-systems, and more specifically, relate to managing read level voltage offsets for low threshold voltage offset bin placements.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 11 is an example of a set of read level voltage offsets as determined in accordance with some embodiments of the present disclosure.

DETAILED DESCRIPTION

Figure 1:
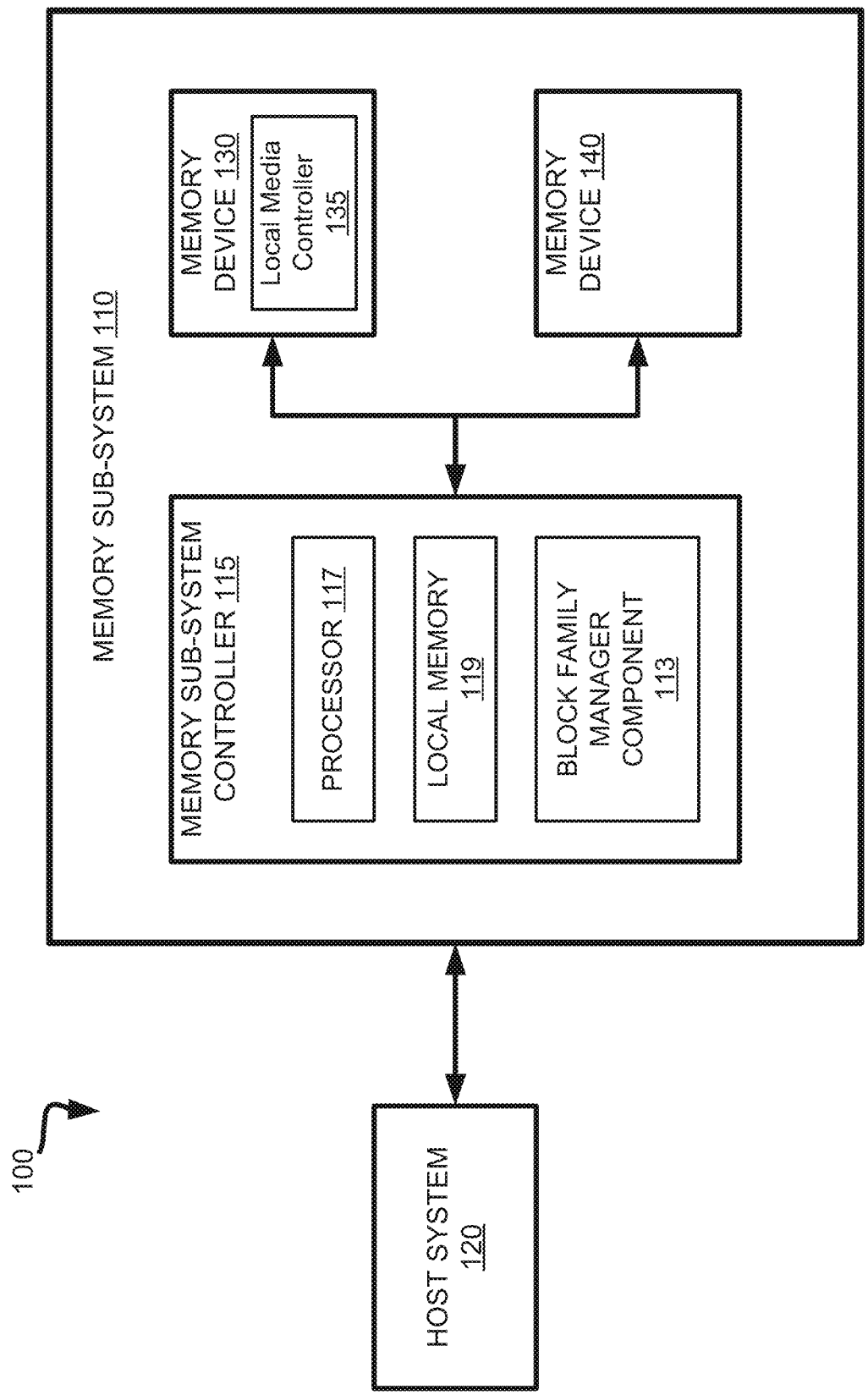
FIG. 1 illustrates an example computing system that includes a memory sub-system in accordance with some embodiments of the present disclosure.

Aspects of the present disclosure are directed to managing read level voltage offsets for low threshold voltage offset bin placements. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a negative-and (NAND) memory device. Other examples of non-volatile memory devices are described below in conjunction with FIG. 1. Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

Various data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error correction code (ECC) codeword, parity code), data version (e.g. used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell which is called as the "threshold voltage" and denoted as $V_T$.

A high-quality memory device can have distributions that are narrow compared with the working range of control voltages tolerated by the cells of the device. Accordingly, multiple distributions (with "valleys" between distributions) can be fit into the working voltage window allowing storing and reliably detecting multiple bits per cell such as $2^3=8$ distributions (7 valleys) for triple level cells (TLC), $2^2=4$ distributions (3 valleys) for multi-level cells (MLC), etc. The distributions are interspersed with voltage intervals ("valley margins") between distributions where none (or very few) of the memory cells of the device have their threshold voltages. Such valley margins can, therefore, be used to separate various charge states—the logical state of the cell can be determined by detecting during a read operation by applying read voltages corresponding to each valley. This effectively allows a single memory cell to store multiple bits of information: a memory cell operated with $2^N$ distributions (which are also called levels) is capable of storing N bits of information. During the read operation, $2^N-1$ read voltages are applied to distinguish $2^N$ distributions. Specifically, the read operation can be performed by comparing the measured threshold voltage $V_T$ exhibited by the memory cell to one or more reference read voltage levels corresponding to known valleys (e.g., centers of the valleys) of the memory device.

Due to the phenomenon known as slow charge loss (SCL), the threshold voltage $V_T$ of a memory cell can change with time as the electric charge of the cell is diminishing, the process sometimes referred to as "temporal voltage shift" (TVS). TVS can include different components such as intrinsic charge loss, system charge loss, quick charge loss, etc. TVS generally increases with increasing number of by Program Erase Cycles (PEC), higher temperatures, and higher program voltages. TVS can show significant die-to-die variation.

Since typical cells store negatively charged particles (electrons), the loss of electrons causes the threshold voltages to shift along the voltage axis towards lower threshold voltages $V_T$. The threshold voltages can change rapidly at first (immediately after the memory cell is programmed) while slowing down at larger times in an approximately log-linear or power-law fashion ($\Delta V_T(t)=-C*t^b$) with respect to the time t elapsed since the cell programming event, referred herein as Time After Program (TAP). TAP can be estimated (e.g., inferred from a data state metric), or directly measured (e.g., from a controller clock). A cell, block, page, block family (groups of blocks), etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice may be referenced by its center point (e.g., 10 minutes). In some embodiments of the present disclosure, TVS can be mitigated by keeping track of the time elapsed since the programming event as well as of the environmental conditions of a particular memory partition (block, plane, etc.) such as temperature and associating a voltage offset $\Delta V_T$ per valley to be used during read operations, where the standard "base read level" threshold voltage $V_T$ (displayed by the cell immediately after programing) is modified by the voltage offset: $V_T \rightarrow V_T+\Delta V_T$ where $\Delta V_T$ is negative due to charge loss. Whereas TVS is a continuous process and the compensating for $\Delta V_T(t)$ can be a continuous function of time, adequate accuracy of offsets can be achieved in some embodiments with a discrete number of threshold voltage offset "bins." "Families" of blocks (or any other memory partitions) programmed within a specified time window and/or under similar environmental (e.g., temperature) conditions can be associated with one of the threshold voltage offset bins. Given that wear-leveling keeps programmed at similar program-erase cycles (PECs), the time elapsed since programming and temperature conditions are among the main factors affecting the amount of TVS, different partitions within a single block family can be presumed to exhibit similar distributions of threshold voltages of their memory cells, and thus would require the same voltage offsets to be applied to the base read levels for read operations.

Block families can be created asynchronously with respect to block programming events. "Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics in terms of temporal voltage shift. A block family may be made with any granularity, containing only whole codewords, whole pages, whole super pages, or whole superblocks, or any combination of these.

Block Family Creation is the process of opening a block family, maintaining that open block family for a duration, and then closing that block family. Opening a block family starts the Open Block Family Tenure, a time during which the drive may write data to the block family or may read data from the block family. Closing a block family starts the Closed Block Family Tenure, a time during which the drive may read data from the block family but not write data to the block family. Invalidating the block family starts the Invalid Block Family Tenure, a time during which the block family contains no data which has not been rendered invalid, normally through garbage collection. The open block family tenure and the closed block family tenure together are the Block Family Tenure.

In an illustrative example, a new block family can be created ("opened") whenever a specified period of time $\Delta t$ (e.g., a predetermined number of minutes) has elapsed since creation of the last block family or whenever the reference temperature of memory cells has changed by more than a specified threshold $\Delta \Theta$ (e.g. 10 C, 20 C, or any other value). Similarly, the family can be "closed" (and a new family can be created) after the time $\Delta t$ has elapsed since the family was created or if the reference temperature has changed (in either direction) by more than $\Delta \Theta$. A memory sub-system controller can maintain an identifier of the active block family, which is associated with one or more blocks as they are being programmed.

The memory sub-system controller can periodically perform a calibration process in order to associate partitions of various families with one of the threshold voltage offset bins. Each threshold voltage offset bin, in turn, can be associated with a set of voltage offsets to be applied for read operations. The associations of partitions with families and families with threshold voltage offset bins is referred herein as auxiliary read metadata (ARM), which represent a part of broader state metrics of the memory device. The state metrics can also include the number of retired physical memory blocks (or other partitions), the number of times various physical blocks have been erased, types of configurations of cells of various memory partitions (e.g., single-level cell vs. multi-level cells), or any other type of information representative of the state of the memory device. The ARM can be stored in metadata tables maintained by the memory sub-system controller.

In accordance with embodiments of the present disclosure, the TVS can be selectively tracked for programmed partitions that are grouped into families. Based on the groupings of partitions into families, appropriate bin-specific read (voltage) offsets are applied to the base read (voltage) levels in read operations. Base read levels can also be stored in the metadata of the memory device. Upon receiving a read command, the memory sub-system controller can (1) identify the family associated with the memory partition identified by the logical address specified in the read command, (2) identify the current threshold voltage offset bin associated with the identified family, (3) determine a set of read offsets for the identified threshold voltage offset bin, (4) compute the new read voltages by additively applying the read offsets associated with the identified threshold voltage offset bin to the base read levels, and (5) perform the read operation using the new read voltage, as described in more detail below.

The calibration process can evaluate a data state metric (e.g., a voltage shift or bit error rate) for each die of each block family with one of a set of predefined threshold voltage offset bins, e.g., by, for each die of each block family, measuring a value of data state metric of a block (of the block family) stored on the die. The calibration process can then update a bin pointer associated with the die and block family to point to a threshold voltage offset bin that corresponds to the measured value of the data state metric. Each threshold voltage offset bin is in turn associated with voltage offsets to be applied for read operations; for TLC with 8 distributions (levels) there are 7 valleys and for a given threshold voltage offset bin, which includes 7 offsets, one for each valley. For example, the bin pointer can remain the same if the data state metric is in a range associated with the existing bin pointer, or can be changed to point to an older bin if the data state metric is in a range associated with the older bin. Although a block family can be associated (by bin pointers) with multiple different bins, a block family is herein referred to as being associated with ("in") a particular one of the bins. More particularly, a block family is associated with (or in) the oldest bin with which a die of the block family is associated.

Generally, the temporal voltage shift for younger block families (i.e., block families that are more recently created) is more significant than the temporal voltage shift for older block families (i.e., block families that are less recently created). The memory sub-system controller can periodically perform the calibration process for each block family based on the age of the block family, which corresponds to the threshold voltage offset bin associated with the block family. For example, in an 8 threshold voltage offset bin architecture, newly created block families can be associated with threshold voltage offset bin-0, while the oldest (i.e., least recently created) block families are associated with threshold voltage offset bin 7. The memory sub-system controller performs the calibration process for the block families in threshold voltage offset bin-0 more frequently than for the block families in threshold voltage offset bin 7, based on the age of the block families associated with threshold voltage offset bin-0 (e.g., based on the logarithmic linear nature of SCL).

In some implementations, the voltage offset associated with each threshold voltage offset bin, when applied to the base read level, minimizes error rates, i.e., there is no other threshold voltage offset set for a specific bin that results in lower error rates. One example of a reliable error rate metric is raw bit error rate (RBER). The RBER corresponds to a number of bit errors per unit of the data stored at the block experiences. When the error rate exceeds a threshold (e.g., exceeds a maximum allowable error rate that is based on ECC correction capability with hard information), the memory sub-system performs error recovery operations that result in increased system latency. In order to achieve low error rates, the calibration scans process more recently created block families would need to be performed much more frequently than of less recently created block families because, as described above, the temporal voltage shift for more recently created block families is more significant. As an example, the temporal voltage shift that a cell experiences between 1 minute and 10 minutes after programming will be similar to the temporal voltage shift experienced between 10 minutes and 100 minutes after programming, and to the temporal voltage shift experienced between 100 minutes and 1000 minutes after programming. To be effective, the calibration process should be more frequent than the amount of time during which block family is associated with a particular threshold voltage offset bin. As an example, assume, on average, a block family is associated with bin-0 for 10 minutes. In this case, the calibration process for bin-0 need to be more frequent than 10 minutes, such as every 5 minutes, to determine whether to associate the block family with bin-1 or not. The calibration process can utilize a significant amount of memory sub-system resources. Furthermore, requests received from the host cannot be executed while the calibration process is ongoing, causing increased latency for the host system potentially impacting QoS (quality of service). Thus, frequently performing the calibration process for more recently created block families in lower threshold voltage offset bins (e.g., bin-0) increases overall system latency.

Aspects of the present disclosure address the above-referenced and other deficiencies by implementing a memory sub-system that reduces the frequency of the calibration process of more recently created block families by extending the time that a block family is allocated to a lower threshold voltage offset bin (e.g., bin-0). The memory sub-system controller can set the read level voltage offset of lower threshold voltage offset bin to values that, when applied to the base read levels, result in a suboptimal error rate not exceeding a maximum allowable error rate (i.e., the system could have used a different set of voltage offsets that results in lower error rate). This can cause the block family to stay longer in lower voltage threshold offset bins, which can reduce the frequency of the calibration process of assigning block families to voltage threshold offset bins. To continue the example provided above, this choice can increase the average amount of time a block family is associated with bin-0 from 10 minutes to, as an example, 30 minutes. Consequently, the calibration process can run every 15 minutes as opposed to every 5 minutes. This decreases the system performance impact of the calibration process. The suboptimal error rate can be an error rate within a predetermined interval below the maximum allowable error rate. The maximum allowable error rate can be, for example, the error rate above which the memory sub-system controller 115 would need to perform additional error recovery operations in order to return valid data (i.e., the hard input ECC decoder correctable error rate).

As block families experience temporal voltage shift, the voltage distributions shift along the voltage axis toward lower voltage levels. As the voltage distributions shift, the memory sub-system controller performs the calibration process to determine the appropriate voltage offsets to be added to the base read level to compensate for the temporal voltage shift among predetermined sets of offset. This is equivalent to assigning each die of a block family to a threshold voltage offset bin which has the corresponding offsets for each valley. Added bin voltage offsets can be negative (i.e., less than zero) given that distributions move to lower voltage values (i.e., charge loss). In embodiments, the memory sub-system controller can add voltage offsets to the base read level of a block family to effectively mimic a shift of the voltage distribution along the voltage axis toward lower voltage levels compared to the levels at the time of programming. If the memory sub-system controller determines read level voltage offsets for bin-0 to be optimal for a later time as opposed to optimal at time-0 (as an example optimal for 30 minutes), the time interval during which a block family would be associated with bin-0 can be extended. This can result in RBER at time-0 to be sub-optimal, i.e., higher than what is possible. However, as long as time-0 RBER is less than hard input ECC decoder correctable error rate, the effect on the memory sub-system is minimal. This approach can be applied to other threshold voltage offset bins as well. In short, the memory sub-system extends the average time a block stays in bin-0 at the expense of sub-optimal (i.e., higher RBER) at time-0.

In embodiments, the memory sub-system controller can determine, based on the calibration process, to change the bin pointer to point the next threshold voltage offset bin if the data state metric is in a range associated with that next threshold voltage offset bin. By adjusting the read level voltage offset of a block family in accordance with embodiments of the present disclosure, the data state metric can reach the range associated with the next threshold voltage offset bin at a later point in time. For example, while the adjusted voltage levels of a block family with no voltage offset at the time of programming might reach the error rate required to move to the next threshold voltage offset bin after 1 hour, the adjusted voltage level of a block family with a voltage offset at the time of programming set in accordance with embodiments of the present disclosure might not reach the error rate required to move to the next voltage until 3 hours after programming. Furthermore, since the frequency of the calibration process is based on the time period during which a block family is associated with a threshold voltage offset bin, by extending the time period that a block family is associated with a particular threshold voltage offset bin, the memory sub-system controller can reduce the frequency of the calibration process for block families in that threshold voltage offset bin.

Advantages of the present disclosure include, but are not limited to, reducing system latency and improving overall quality of service by extending the time period during which block families are associated with lower threshold voltage offset bins, thus reducing the frequency of operations associated with bin calibration. Each calibration operation of the memory device consumes valuable resources. By calibrating the block family to have a higher error rate at the time of programming, aspects of the present disclosure extend the time periods during which block families are associated with lower created threshold voltage offset bins (e.g., bin-0). Since the frequency of the calibration process is based on the amount of time block families are associated with a threshold voltage offset bin, by extending the time block families are associated with lower threshold voltage offset bins (e.g., bin-0), aspects of the present disclosure reduce the frequency of calibration when bin families are in bin-0. Performing less frequent calibration frees up resources that can be used for other operations, thus reducing the latency and improving the system performance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a block family manager component 113 that can set the read offset voltage levels for block families in a threshold voltage offset bin (e.g., in threshold voltage offset bin-0) in order to maximize the time period during which a given block family is associated with a particular threshold voltage offset bin. In some embodiments, the memory sub-system controller 115 includes at least a portion of the block family manager component 113. In some embodiments, the block family manager component 113 is part of the host system 110, an application, or an operating system. In other embodiments, local media controller 135 includes at least a portion of block family manager component 113 and is configured to perform the functionality described herein.

The block family manager component 113 can determine a read level offset to associate with a threshold voltage offset bin in order to maximize the time period during which a given block family is associated with a particular threshold voltage offset bin (e.g., threshold voltage offset bin-0). The block family manager component 113 can create a block family and associate the block family with a threshold voltage offset bin. In embodiments, the block family can be created by grouping blocks as they are programmed. The grouping can be based on a time range and/or a temperature range within which the blocks were programmed. The block family manager component 113 can associate the block family with a threshold voltage offset bin by updating the block family metadata.

The block family manager component 113 can determine a set of read level voltage offsets to apply to the threshold voltage offset bin in order to maximize the time period during which a given block family is associated with a particular threshold voltage offset bin. This process can be called "bin-offset calibration process." The bin-offset calibration process can include generating and/or determining a set of read level voltage offsets to apply for each threshold voltage offset bin. For example, if there are 8 threshold voltage offset bins associated with a TLC, the bin-offset calibration process can generate a set of read level voltage offset for each of the 8 threshold voltage offset bins, and each set can include 7 read level voltage offsets, once for each valley. An example set of read level voltage offsets is described with respect to FIG. 11.

In embodiments, in order to determine the set of read level voltage offsets to apply, the block family manager component 113 can identify sets of read level voltage offsets. The sets of read level voltage offsets can be stored in non-volatile memory device 130. Additionally or alternatively, block family manager component 113 can generate the sets of read level voltage offsets that fall within a certain range. For example, if the threshold voltages of a block usually shift toward a certain threshold voltage in the time period that the block is associated with a particular threshold voltage offset bin (e.g., bin-0), the block family manager component 113 can generate the sets of read level voltage offsets to be within 0 and the certain threshold voltage shift usually experienced by blocks associated with that threshold voltage offset bin (e.g., bin-0). The block family manager component 113 can determine an average voltage shift when determining the range for the sets of read level voltage offsets, or can determine a maximum voltage shift when determining the sets of read level voltage offsets. In embodiments, the block family manager component 113 can use a minimum threshold voltage offset, the mean threshold voltage offset, or some other measurement, in generating the sets of read level voltage offsets. The bin-offset calibration process of determining the sets of read level voltage offsets associates with each threshold voltage offset bin to extend the time a block family is associated with a particular bin (such as bin-0) while not exceeding the allowed/predetermined error rate can be done at the manufacturing phase of the memory sub-system ahead of the customer usage. As a result, read level voltage offsets are available once the memory sub-system is used by the customer, and the calibration process assigns the block families to threshold voltage offset bins which use the pre-determined read level voltage offsets. Alternatively, the bin-offset calibration process can be done periodically with a pre-determined cadence during the lifetime of the memory sub-system.

The block family manager component 113 can perform a series of read operations for the block family using the multiple sets of voltage offsets. Each read operations in the series of read operations uses one of the sets voltage offsets. Each set of voltage offsets includes a voltage offset for each valley of the memory cell being read. In embodiments, the series of read operations can be performed on randomly selected blocks or pages within the block family. The block family manager component 113 can then select the read operations from the series of read operations that resulted in a suboptimal error rate not exceeding a maximum allowable error rate, i.e., an error rate that is within a predetermined interval below the maximum allowable error rate. The predetermined interval can be, e.g., a predetermined share (such as ½ or ¾) of the maximum allowable error rate. Thus, for each read operation in the series of read operations, the block family manager component 113 can determine an error rate associated with a set of voltage offsets associated with that read operation. The block family manager component 113 can then select the voltage offset associated with the read operation that resulted in a suboptimal error rate not exceeding a maximum allowable error rate. Among the set of bin-offset voltages, the selected voltage offsets result in the lowest error rate, however this lowest error rate is suboptimal in the sense that a different set of bin-offset voltage results in lower error rate. In embodiments, the block family manager component 113 can set the maximum allowable error rate to a certain percentage of the hard decode error rate, for example, to 90% of the hard decode rate, to allow for a margin of error. The bin-offset calibration process of determining the read level offset voltages to extend the time a block family stays in a particular bin (such as bin-0) while not exceeding the predetermined maximum allowed error rate can be done at the manufacturing phase of the memory sub-system ahead of the customer usage. As a result, read level voltage offsets for each bin are available once the memory sub-system is used by the customer, and the calibration process assigns the block families to bins which use the pre-determined read level voltage offsets.

By setting the read level voltage offset of the threshold voltage offset bin to a level that results in a suboptimal error rate not exceeding a maximum allowable error rate at the time of programming, the block family can remain associated with the threshold voltage offset bin for a longer period of time. The block family manager component 113 can thus reduce the frequency of the calibration process performed while the block family is associated with the threshold voltage offset bin.

In embodiments, the block family manager component 113 applies a set of read level voltage offsets for background operations, including read operations used to determine the health status of a memory device. To determine an accurate health status of a memory device, the block family manager component 113 can perform the background read operation using a threshold voltage offset that minimizes the error rate, rather than a threshold voltage offset that extends the time period during which a block family is associated with a particular threshold voltage offset bin. Thus, in response to determining that a read operation is a background operation, the block family manager component 113 can apply a set of read level voltage offsets that can result in an error rate below a threshold value. That is, the block family manager component 113 can determine the set of read level voltage offsets that results in the lowest error rate, or that results in an error rate below a threshold value. The block family manager component 113 can then apply that set of read level voltage offsets to minimize the error rate for background read operations. In other embodiments, for background read operations, the block family manager component 113 can use special read modes that deliver lowest possible error rates. These special read modes can determine on-the-fly read-level offsets that optimize the read threshold voltage levels to deliver lowest possible error rate.

Further details with regards to the operations of the block family manager component 113 are described below.

Figure 2:
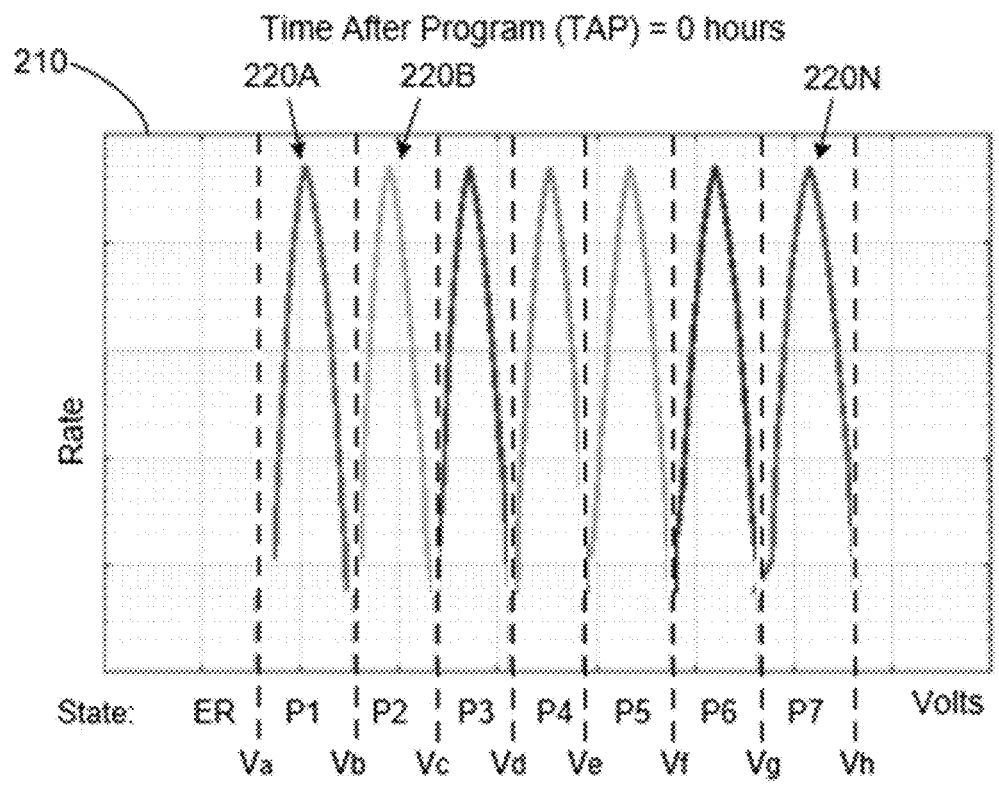
FIG. 2 schematically illustrates the temporal voltage shift caused by the slow charge loss exhibited by triple-level memory cells, in accordance with some embodiments of the present disclosure.
Figure 2:
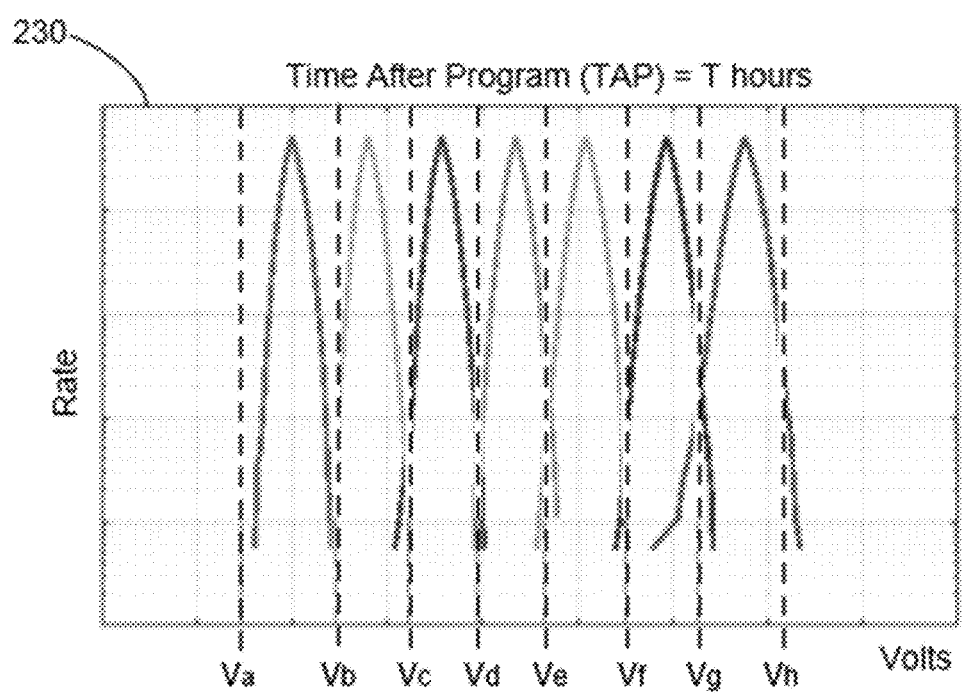

FIG. 2 schematically illustrates the temporal voltage shift caused by the slow charge loss exhibited by triple-level memory cells, in accordance with some embodiments of the present disclosure. While the illustrative example of FIG. 2 utilizes triple-level cells, the same observations can be made and, accordingly, the same remedial measures are applicable to single level cells and multi-level cells, as well as any other fractional or whole number of bits per cell (e.g., 3.5 bits per cell, etc.), in order to compensate for the slow charge loss.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrate program voltage distributions 220A-220N (also referred to as "program distributions" or "voltage distributions" or "distributions" or "levels" herein) of memory cells programmed by a respective write level (which can be assumed to be at the midpoint of the program distribution) to encode a corresponding logical level ("000" through "111" in case of a TLC). The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The read threshold voltage levels are labeled Va-Vh. As shown, any measured voltage below Va is associated with the ER state. The states labeled P1, P2, P3, P4, P5, P6, and P7 correspond to distributions 220A-220N, respectively.

Time After Program (TAP) herein shall refer to the time since a cell has been written and is the primary driver of TVS (temporal voltage shift) along with temperature. TVS captures SCL as well as other charge loss mechanisms. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from X to Y minutes or hours after program). A time slice can be referenced by its center point.

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages need to be adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 3:
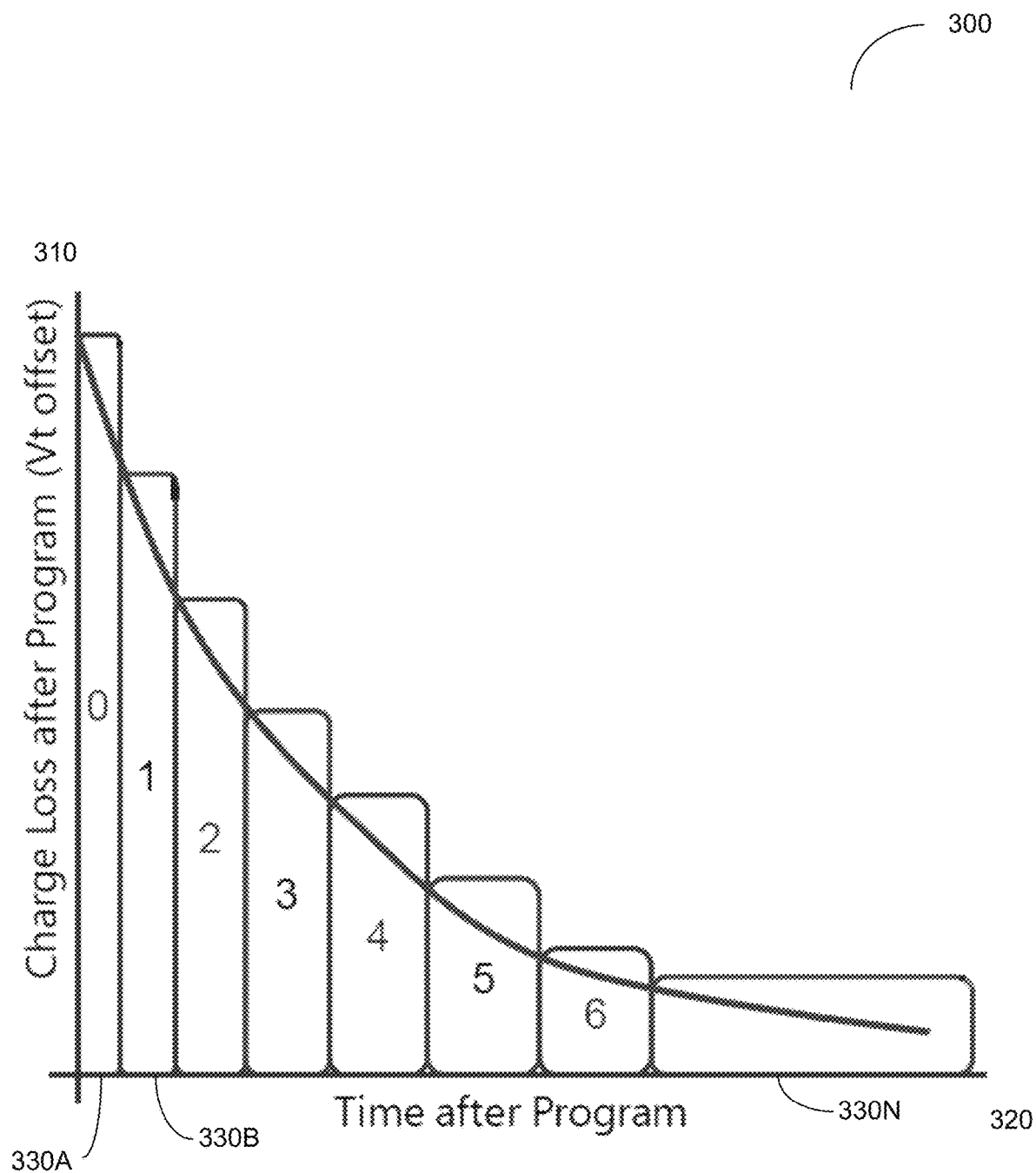
FIG. 3 depicts an example graph illustrating the dependency of the threshold voltage offset on the time after program (i.e., the period of time elapsed since the block had been programmed), in accordance with embodiments of the present disclosure FIG. 4 schematically illustrates a set of predefined threshold voltage offset bins, in accordance with embodiments of the present disclosure.

FIG. 3 depicts an example graph 300 illustrating the dependency of the threshold voltage offset 310 on the time after program 320 (i.e., the period of time elapsed since the block had been programmed), in accordance with embodiments of the present disclosure. As schematically illustrated by FIG. 3, block families of the memory device are grouped into bins 330A-330N, such that each block family includes one or more blocks that have been programmed within a specified time window and a specified temperature window. As noted herein above, since the time elapsed after programming and temperature are the main factors affecting the temporal voltage shifts, all blocks and/or partitions within a block family are presumed to exhibit similar distributions of threshold voltages in memory cells, and thus would require the same voltage offsets to be applied to the base read levels for read operations.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin-0. Then, the memory sub-system controller can periodically perform a foreground or background calibration process in order to associate each die of every block family with one of the predefined threshold voltage offset bins (bins 0-7 in the illustrative example of FIG. 3), which is in turn associated with the voltage offsets to be applied for read operations. The associations of blocks with block families and block families and dies with threshold voltage offset bins can be stored in respective metadata tables maintained by the memory sub-system controller.

Figure 4:
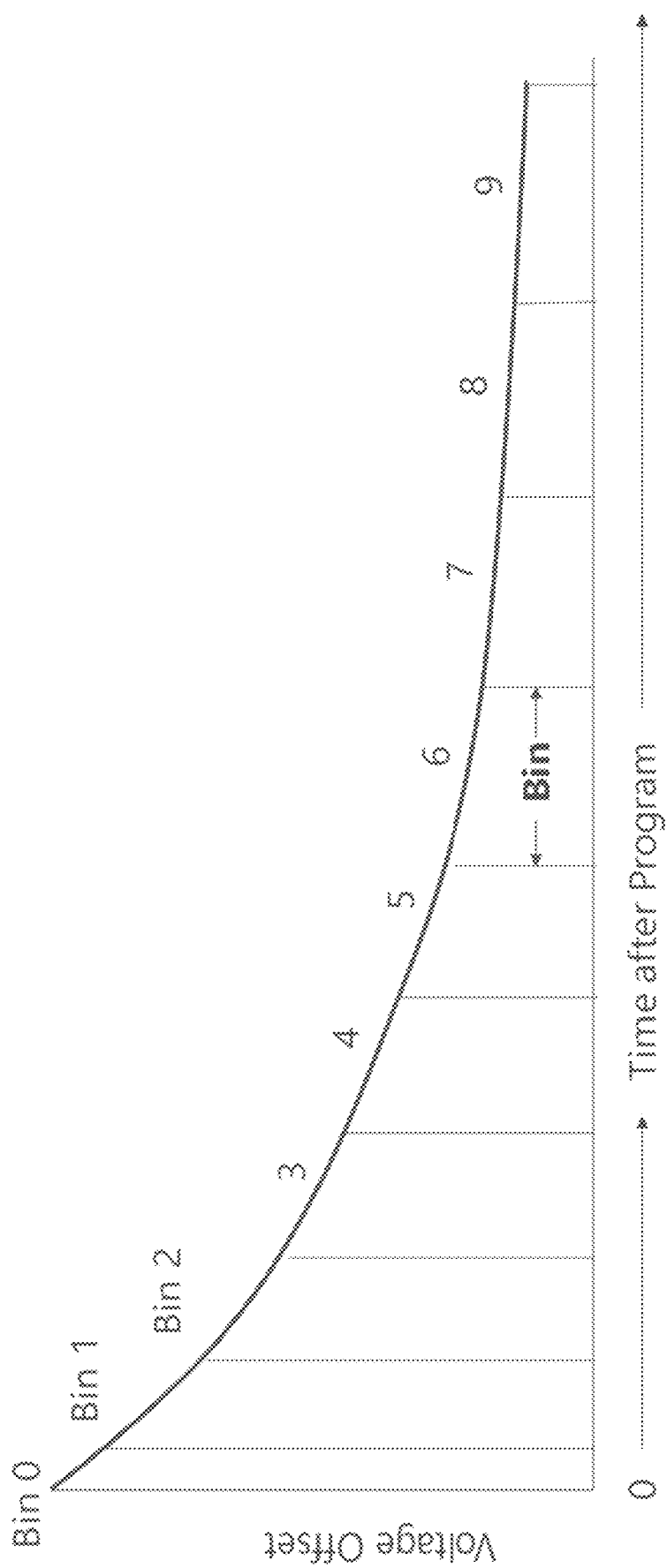

FIG. 4 schematically illustrates a set of placed threshold voltage offset bins (bin-0 to bin 9), in accordance with embodiments of the present disclosure. As schematically illustrated by FIG. 4, the threshold voltage offset graph can be subdivided into multiple threshold voltage offset bins, such that each bin corresponds to a range of threshold voltage offsets. While the illustrative example of FIG. 4 defines ten bins, in other implementations, various other numbers of bins can be employed (e.g., 64 bins).

The memory sub-system controller can associate each die of every block family with a threshold voltage offset bin, based on a periodically performed calibration process. The calibration process selects the set of threshold voltage offsets to be applied to the base voltage read level in order to perform read operations. The calibration process involves performing, with respect to a specified number of randomly selected pages or blocks within the block family that is being calibrated, read operations utilizing different set of threshold voltage offsets, and choosing the set of threshold voltage offset that results in a defined error rate (e.g., a bit error rate) of the read operation. The defined error rate can be a minimum error rate, or it can be an error rate that falls within a certain range. In embodiments, the memory sub-system controller can choose the set of threshold voltage offsets that, when applied to the base read levels, results in a suboptimal error rate not exceeding a maximum allowable error rate, i.e., an error rate that is within a predetermined interval below the maximum allowable error rate. The predetermined interval can be, e.g., a predetermined share (such as ½ or ¾) of the maximum allowable error rate. Further details regarding the calibration process are provided with respect to FIG. 9.

Figure 5:
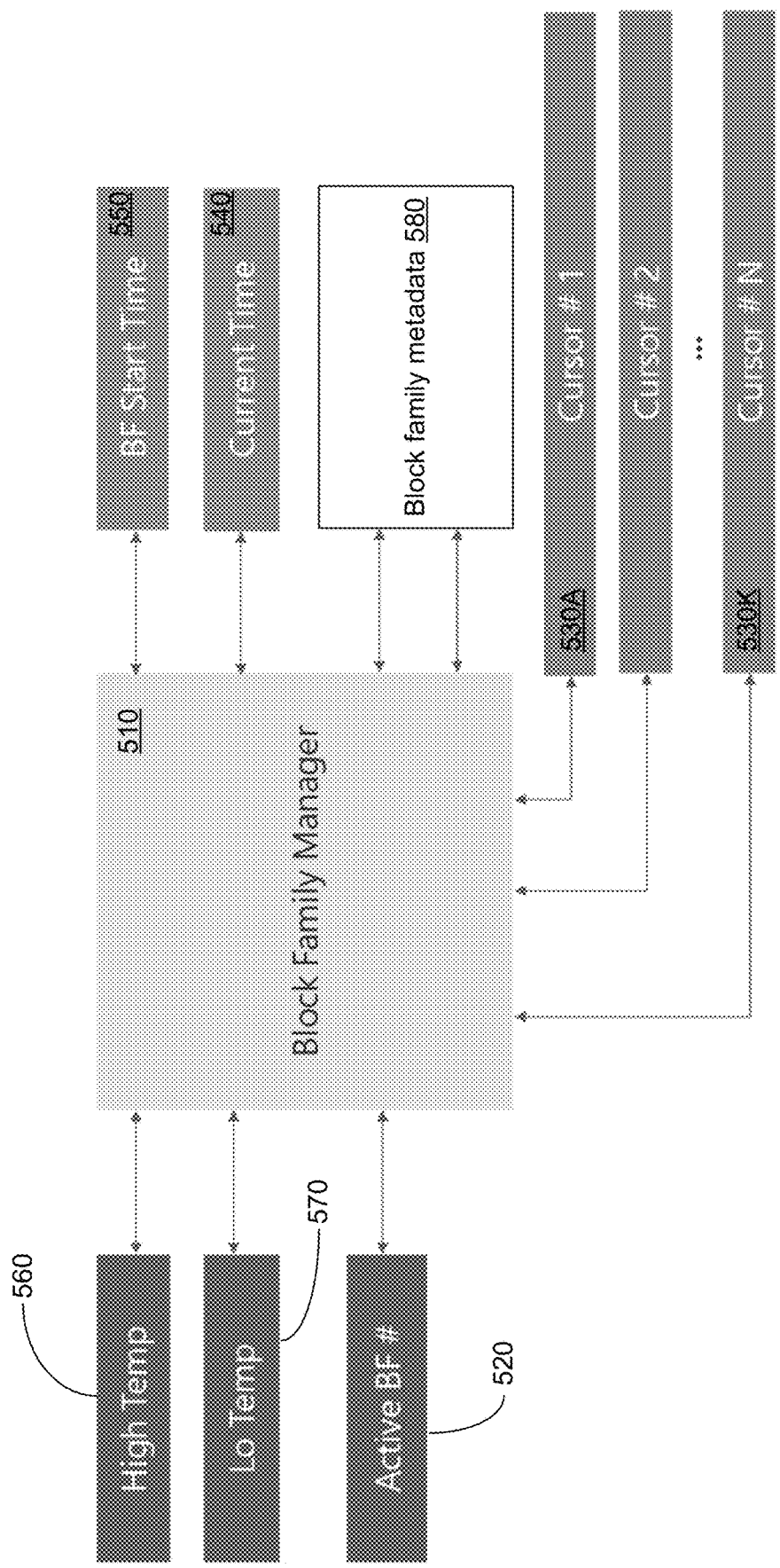
FIG. 5 schematically illustrates block family management operations implemented by the block family manager component of the memory-sub-system controller operating in accordance with embodiments of the present disclosure.

FIG. 5 schematically illustrates block family management operations implemented by the block family manager component of the memory-sub-system controller operating in accordance with embodiments of the present disclosure. As schematically illustrated by FIG. 5, the block family manager 510 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, the current time 540 is stored in a memory variable as the block family start time 550. As the pages or blocks are programmed, the current time 540 is compared to the block family start time 550. Responsive to detecting that the difference of the current time 540 and the block family start time 550 is greater than or equal to the specified time period (e.g., a predetermined number of minutes), the memory variable storing the active block family identifier 520 is updated to store the next block family number (e.g., the next sequential integer number), and the memory variable storing the block family start time 550 is updated to store the current time 540.

The block family manager 510 can also maintain two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can close the existing block family and can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, the memory sub-system controller associates the block with the currently active block family. The association of each block with a corresponding block family is reflected by the block family metadata 580, as described in more detail herein below with reference to FIG. 7.

As noted herein above, based on a periodically performed calibration process, the memory sub-system controller associates each die of every block family with a threshold voltage offset bin, which defines a set of threshold voltage offsets to be applied to the base voltage read level in order to perform read operations. The calibration process involves performing, with respect to a specified number of selected blocks within the block family that is being calibrated, read operations utilizing different threshold voltage offsets, and choosing the bin that results in an error rate of the read operation within a defined range. The block within the block family can be randomly selected, or selected based on satisfying a specific criterion (such as being oldest in the block family).

In some embodiments, the frequency at which the memory sub-system controller performs the calibration process for each threshold voltage offset bin can be based on the time period during which block families are associated with a particular threshold voltage offset bin. The memory sub-system controller can determine the threshold voltage offset to associate with a threshold voltage offset bin in order to maximize the time period during which block families are associated with particular threshold voltage offset bins, thus reducing the frequency at which the memory sub-system controller performs the calibration process.

Figure 6:
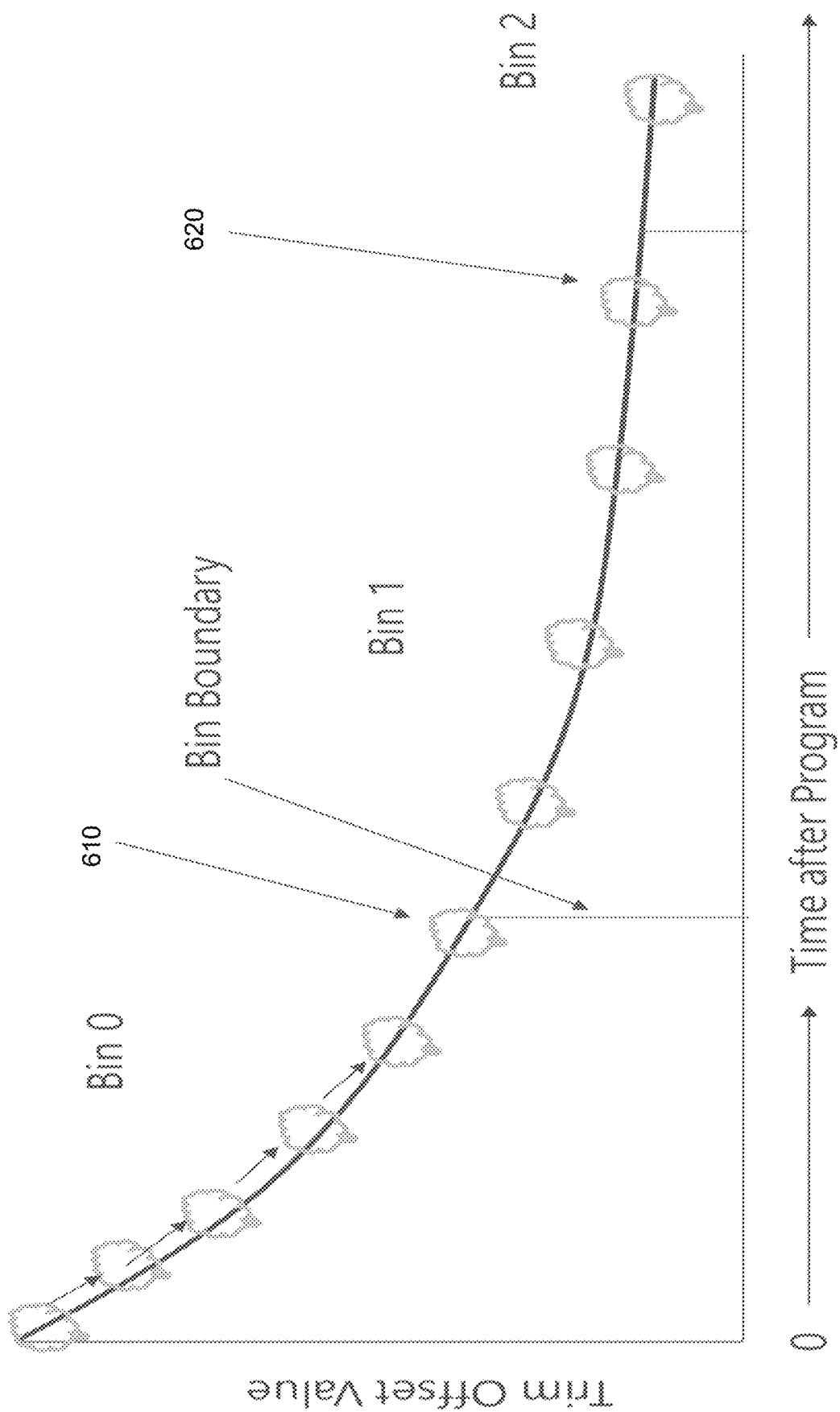
FIG. 6 schematically illustrates selecting block families for calibration, in accordance with embodiments of the present disclosure.

FIG. 6 schematically illustrates selecting block families for calibration, in accordance with embodiments of the present disclosure. As schematically illustrated by FIG. 6, the memory sub-system controller can limit the calibration operations to the oldest block family in each bin (e.g., block family 610 in bin-0 and block family 620 in bin 1), since it is the oldest block family that will, due to the slow charge loss, migrate to the next bin before any other block family of the current bin.

Figure 7:
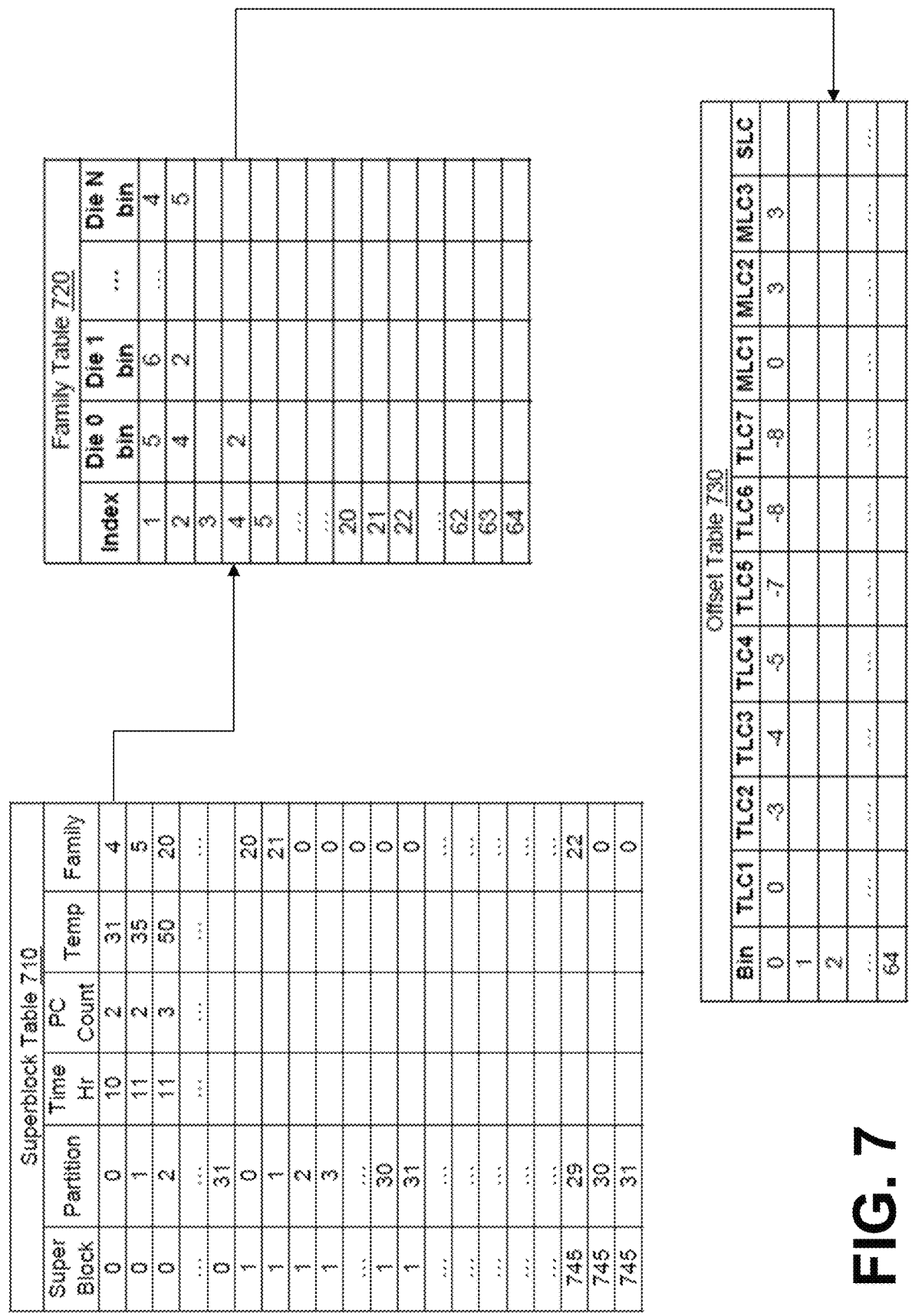
FIG. 7 schematically illustrates example metadata maintained by the memory sub-system controller for associating blocks and/or partitions with block families, in accordance with embodiments of the present disclosure.

FIG. 7 schematically illustrates example metadata maintained by the memory sub-system controller for associating blocks and/or partitions with block families, in accordance with embodiments of the present disclosure. As schematically illustrated by FIG. 7, the memory sub-system controller can maintain the superblock table 710, the family table 720, and the offset table 730.

Each record of the superblock table 710 specifies the block family associated with the specified superblock and partition combination. In some implementations, the superblock table records can further include time and temperature values associated with the specified superblock and partition combination.

The family table 720 is indexed by the block family number, such that each record of the family table 720 specifies, for the block family referenced by the index of the record, a set of threshold voltage offset bins associated with respective dies of the block family. In other words, each record of the family table 720 includes a vector, each element of which specifies the threshold voltage offset bin associated with the die referenced by the index of the vector element. The threshold voltage offset bins to be associated with the block family dies can be determined by the calibration process, as described in more detail herein above.

Finally, the offset table 730 is indexed by the bin number. Each record of the offset table 730 specifies a set of threshold voltage offsets (e.g., for TLC, MLC, and/or SLC) associated with threshold voltage offset bin. The memory sub-system controller can determine the threshold voltage offsets, as described in more detail herein below with reference to FIGS. 9 and 10.

The metadata tables 710-730 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 710 is used to identify the block family identifier corresponding to the physical block number; then, the block family identifier is used as the index to the family table 720 in order to determine the threshold voltage offset bin associated with the block family and the die; finally, the identified threshold voltage offset bin is used as the index to the offset table 730 in order to determine the threshold voltage offset corresponding to the bin. The memory sub-system controller can then additively apply the identified threshold voltage offset to the base voltage read level in order to perform the requested read operation.

In the illustrative example of FIG. 7, the superblock table 710 maps partition 0 of the superblock 0 to block family 4, which is utilized as the index to the family table 720 in order to determine that die 0 is mapped to bin 2. The latter value is used as the index to the offset table in order to determine the threshold voltage offset values for bin 2.

Figure 8:
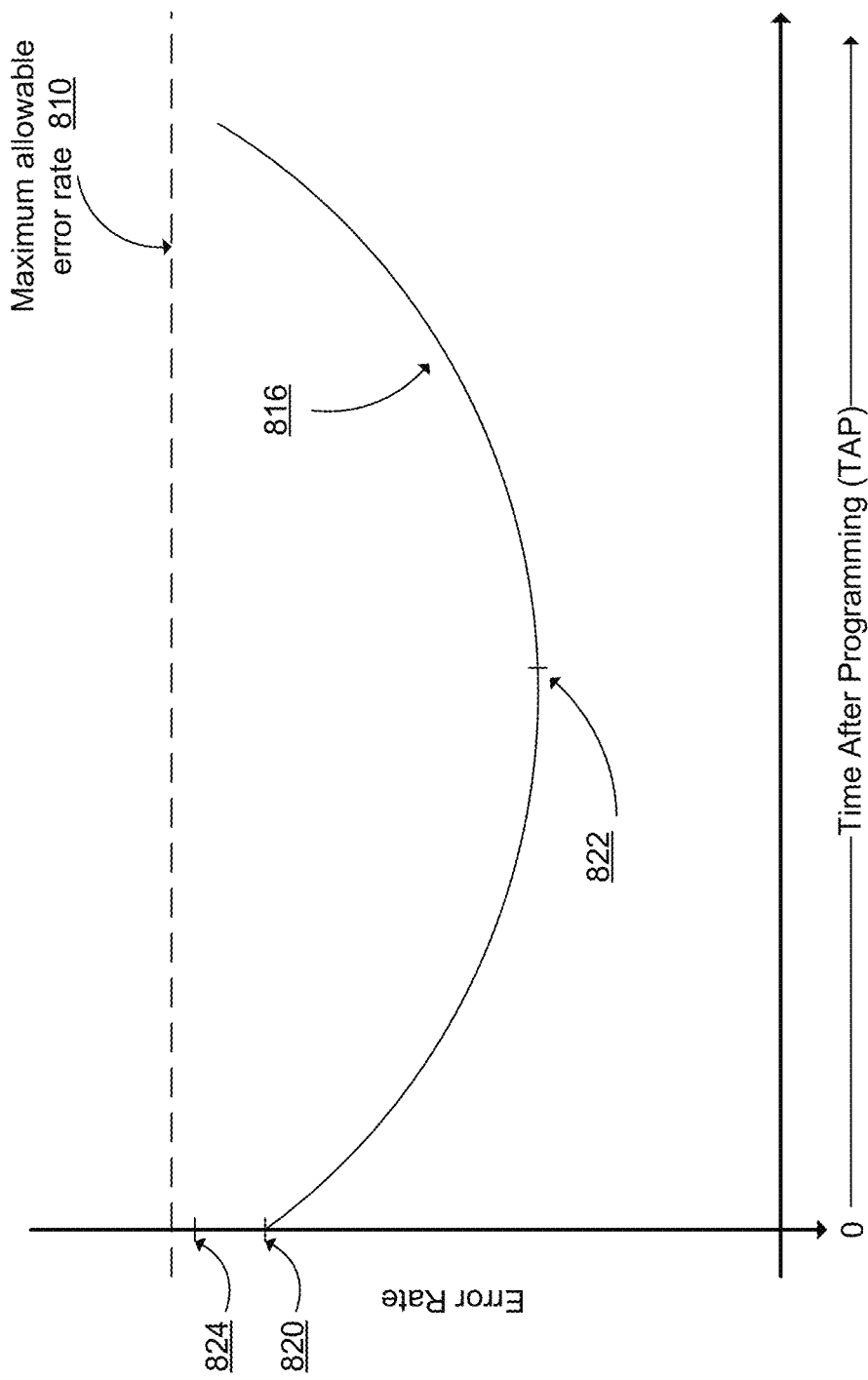
FIG. 8 depicts an example graph illustrating the progression of the error rate in the time after programming, in accordance with embodiments of the present disclosure.

FIG. 8 depicts an example graph illustrating the progression of the error rate in the time after programming, in accordance with embodiments of the present disclosure. The x-axis represents the time after programming. The y-axis represents the error rate associated with a read operation performed using the adjusted threshold voltage (i.e., the threshold offset voltage referenced by the threshold voltage offset bin added to the base voltage read level). In embodiments, the error rate metric is the raw bit error rate (RBER). Line 810 represents the maximum allowable error rate. In embodiments, line 810 can be determined based on a trigger metric. A trigger metric refers to a measurement that indicates or is related to the extent to which a memory device must enter error recovery. In one implementation, trigger metric can be a trigger rate representing the share of codewords with high error rates of the memory device that are not correctable when read outside of an error handling process. Line 810 can be determined based on hard ECC correction capability while meeting a predefined trigger rate requirement.

Line 816 represents the progression of the error rate associated with a read operation performed using the adjusted threshold voltage, as determined by embodiments of the present disclosure. As illustrated in FIG. 8, embodiments of the present disclosure enable the memory sub-system controller to assign a set of threshold voltage offsets to low threshold voltage offset bins (e.g., bin-0) such that a read operation performed at time 0 can have a suboptimal error rate not exceeding the maximum allowable error rate (810). The set of threshold voltage offsets associated with low threshold voltage offset bins (e.g., bin-0), as determined in accordance with embodiments of the present disclosure, can simulate a large threshold voltage shift which a cell will experience at a higher TAP. At the time of programming, the error rate of read operations performed using the set of threshold voltage offsets as determined in accordance with embodiments of the present disclosure can be high, for example, illustrated as error rate 820 in FIG. 8. As the threshold voltages to shift along the voltage axis towards lower threshold voltages in the time after programming, the error rate associated with of read operations performed using the set of threshold voltage offsets, as determined in accordance with embodiments of the present disclosure, can decrease, as is illustrated in FIG. 8. In embodiments, the threshold voltages can shift along the voltage axis to a threshold voltage such that, when combined with the set of threshold voltage offsets as determined in accordance with embodiments of the present disclosure, results in a lower error rate, for example, as illustrated as error rate 822 in FIG. 8. That is, the set threshold voltage offsets associated with a low threshold voltage offset bin (e.g., bin-0) counteracts the threshold voltage shift experienced by the block. As the threshold voltages continue to shift along the voltage axis, the error rate associated with of read operations performed using the set of threshold voltage offsets as determined in accordance with embodiments of the present disclosure can begin to increase, as is illustrated in FIG. 8.

As time passes and the electric charge in the programmed cells decreases, the threshold voltage associated with low threshold voltage offset bins can cause the error rate to decrease before increasing again, as illustrated in FIG. 8. Hence, the time it takes for a block family to reach the trigger rate required to move the block family to the next threshold voltage offset bin is extended. For example, error rate 824 can represent the trigger rate associated with moving a block family to the next threshold voltage offset bin. Once the error rate associated with a read operation performed using the set of threshold voltage offsets as determined in accordance with embodiments of the present disclosure reaches error rate 824, the block family manager can associate the block family with the another threshold voltage offset bin which will deliver error rate lower than 824. By associating a low threshold voltage offset bins (e.g., bin-0) with threshold voltage offsets in accordance with embodiments of the present disclosure, the block family manager can extend the amount of time it takes to reach that error rate. For example, the block family can reach the trigger rate in 6 hours after programming, rather than 1 hour after programming. Thus, if the memory sub-system performs 3 calibrations while a block family is in bin-0, for example, conventional memory sub-systems would perform a calibration every 20 minutes while the block family is in bin-0. Using an adjusted voltage read level for bin-0 in accordance with embodiments of the present disclosure, the memory sub-system controller can perform a calibration every 2 hours while a block family is in bin-0. Reducing the frequency of the calibrations process frees up memory sub-system resources, thus reducing the latency and improving the system performance.

Figure 9:
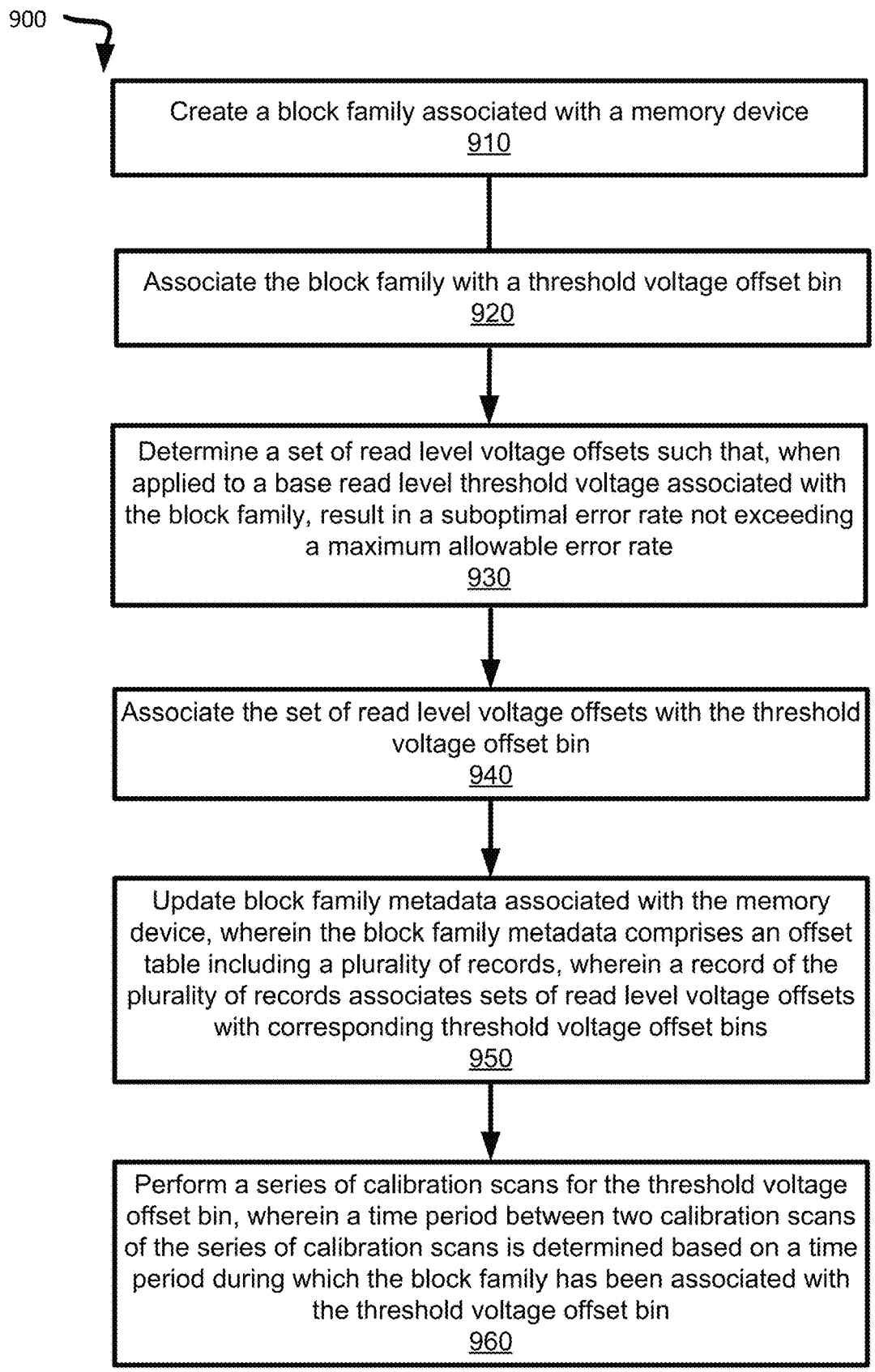
FIG. 9 is a flow diagram of an example method to determine a set of read level voltage offsets for a threshold voltage offset bin, in accordance with some embodiments of the present disclosure.

FIG. 9 is a flow diagram of an example method 900 to determine a set of read level voltage offsets for a threshold voltage offset bin, in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, the processing logic creates a block family associated with a memory device. In creating a block family, processing logic can initialize a block family associated with the memory device, and store an identifier of the block family. The processing logic can initialize a timeout associated with the block family. Responsive to programming a block residing on the memory device, the processing logic can associate the block with the block family. Responsive to detecting expiration of the timeout, the processing logic can close the block family.

In embodiments, the processing logic can also initialize a low temperature and a high temperature associated with the block family to store the current temperature of selected die of the memory device (e.g., a randomly selected die). Responsive to determining that the difference between the high temperature and the low temperature values is greater than or equal to a specific temperature threshold value, the processing logic can close the block family.

At operation 920, the processing logic associates the block family with a threshold voltage offset bin. In embodiments, processing logic associates the block family with a low threshold voltage offset bin (e.g., bin-0) at the time of programming. The processing logic can associate the block family with a threshold voltage offset bin by updating block family metadata associated with the memory device. The block family metadata can include a data structure, for example a table, which stores records. Each record in the table associates a block with the block family. An example of block family metadata is described with respect to FIG. 7.

At operation 930, the processing logic determines and/or selects a set of read level voltage offsets from a plurality of sets of read level voltage offsets such that, when applied to a base read level threshold voltage associated with the block family, result in a suboptimal error rate not exceeding a maximum allowable error rate. In embodiments, the error rate can be the raw bit error rate (RBER). The sets of read level voltage offsets can be generated when the memory sub-system is manufactured, or during usage of the memory sub-system.

The processing logic can perform a series of read operations for the block family using a plurality of sets of voltage offsets. The processing logic can identify, among the series of read operations, a read operation from the series of read operations that results in a bit error rate within a predetermined interval below the maximum allowable error rate. For example, the predetermined interval can be a predetermined share (e.g. ½ or ¾) of the maximum allowable error rate. The processing logic can then determine and/or select the set of voltage offsets that was used to perform the identified read operation, i.e., the read operation that resulted in a bit error rate within the predetermined interval.

In embodiments, the maximum allowable error rate can be determined for a specific trigger metric, and the hard input ECC decoder correction capability. A trigger metric can refer to a measurement that indicates or is related to the extent to which a memory device must enter error recovery. In embodiments, the memory sub-system controller can set the maximum allowable bit error rate to a value below the hard input ECC decoder correction capability while meeting the trigger metric. For example, the maximum allowable bit error rate can be 5% less than hard input ECC decoder correction capability, to allow for a margin of error.

At operation 940, the processing logic associates the set of read level voltage offsets with the threshold voltage offset bin. At operation 950, the processing logic updates block family metadata associated with the memory device. The block family metadata can include an offset table that associates read level voltage offsets with corresponding threshold voltage offset bins. An example of an offset table is shown in FIG. 7.

At operation 960, the processing logic performs a series of calibrations for the threshold voltage offset bin. The calibrations can update a bin pointer associated with the block family to point to a threshold voltage offset bin that corresponds to a measured value of a data state metric, such as a bit error rate. The time period between two calibrations of the series of calibrations is determined based on the time period during which the block family has been associated with the threshold voltage offset bin.

In embodiments, the processing logic can receive a command specifying an identifier of a logical block. The processing logic can translate the identifier of the logical block into a physical address of a physical block stored on the memory device. The physical address can include an identifier of a memory device die. In an illustrative example, the translation is performed by looking up the logical block identifier (also referred to as logical block address, or LBA) in a logical-to-physical (L2P) table associated with the memory device. The L2P table includes multiple mapping records, such that each mapping record maps an LBA to a corresponding physical address. For flash memory devices, the physical address can include channel identifier, die identifier, page identifier, plane identifier and/or frame identifier.

The processing device identifies, based on block family metadata associated with the memory device, the block family associated with the physical address. In an illustrative example, the processing device utilizes the superblock table 710 of FIG. 7 in order to identify the block family associated with the physical address.

The processing device determines a threshold voltage offset associated with the block family and the memory device die. In an illustrative example, the processing device utilizes the block family table 720 of FIG. 7, in order to determine the bin identifier corresponding to the combination of the block family identifier and the die identifier. The processing device then utilizes the offset table 730 of FIG. 7 in order to determine the threshold voltage offsets for the identified threshold voltage offset bin. The processing device computes a modified threshold voltage by applying the identified threshold voltage offset to a base read level voltage associated with the memory device. As noted herein above, the base read level voltage can be stored in the metadata area of the memory device. The processing device utilizes the computed modified threshold voltage in order to perform the requested read operation.

Figure 10:
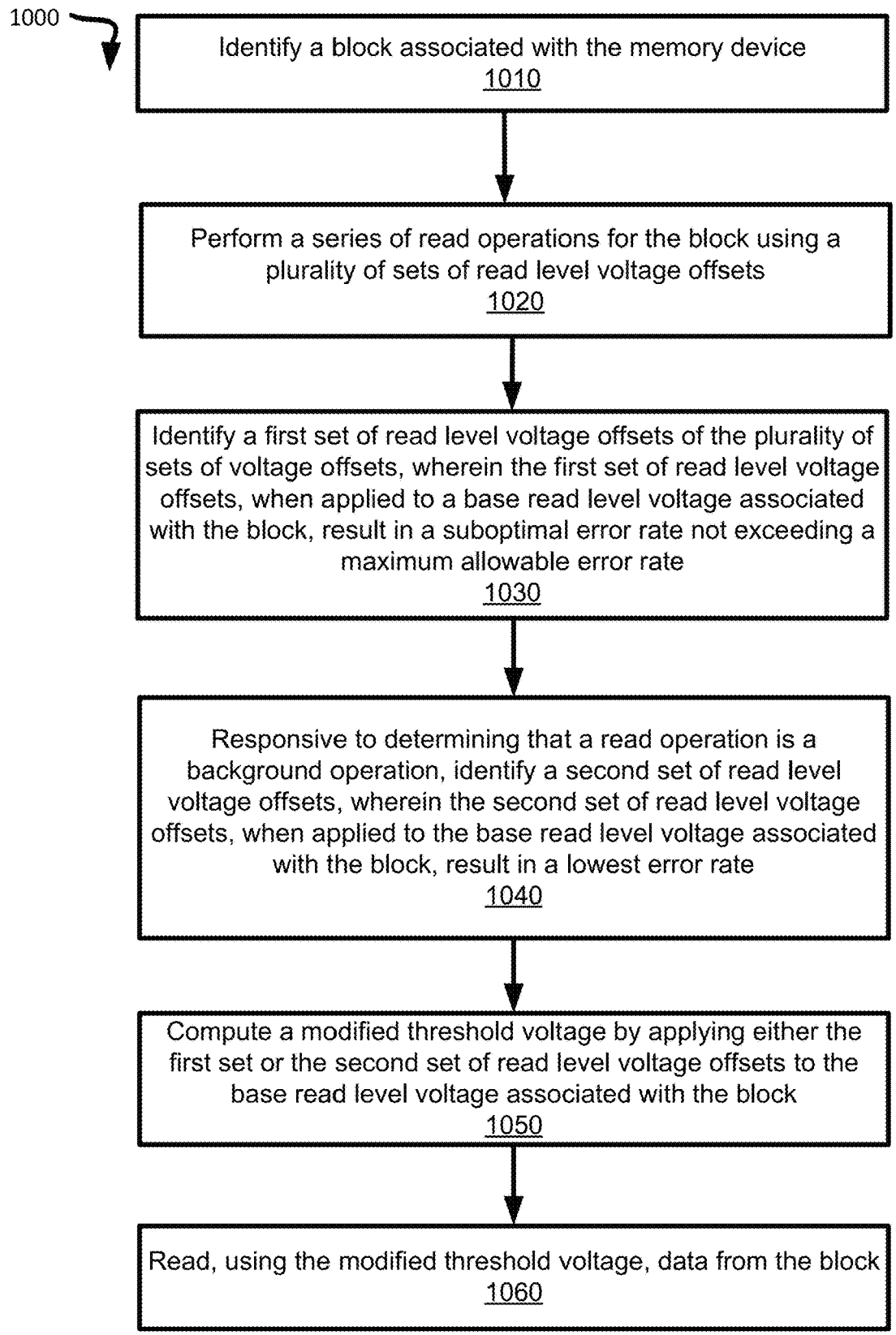
FIG. 10 is a flow diagram of an example method to determine a set of read level voltage offsets for a read operation, in accordance with some embodiments of the present disclosure.

FIG. 10 is a flow diagram of an example method 1000 to determine a set of read level offsets for a read operation, in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1010, the processing logic identifies a block associated with the memory device. In embodiments, the processing logic can identify a block specified in a read request received from a host. Alternatively, the processing logic can identify a block on which to perform memory management operations.

At operation 1020, the processing logic performs a series of read operations for the block using a plurality of sets of voltage offsets. Each read operations in the series of read operations uses one of the sets voltage offsets. Each set of voltage offsets includes a voltage offset for each valley of the memory cell being read. The plurality of sets of voltage offsets can be stored within the memory sub-system, or can be constructed by the memory sub-system controller.

At operation 1030, the processing logic identifies a first set of read level voltage offsets of the plurality of sets of read level voltage. The first set of read level voltage offsets, when applied to a base read level voltage associated with the block, result in a suboptimal error rate not exceeding a maximum allowable error rate.

The processing logic can identify, among the series of read operations, a read operation from the series of read operations that results in a bit error rate within a predetermined interval below the maximum allowable error rate. For example, the predetermined interval can be a predetermined share (e.g. ½ or ¾) of the maximum allowable error rate. The processing logic can then determine the set of voltage offsets that was used to perform the identified read operation, i.e., the read operation that resulted in a bit error rate within the predetermined interval.

In embodiments, the maximum allowable error rate can be the hard decode error level for a predefined trigger metric. A trigger metric can refer to a measurement that indicates or is related to the extent to which a memory device must enter error recovery. In embodiments, the memory sub-system controller can set the maximum allowable bit error rate to a value below the hard input ECC decoder correction capability in terms of an error level. For example, the maximum allowable bit error rate can be 5% less than hard input ECC decoder correction capability, to allow for a margin of error.

At operation 1040, the processing logic determines that a read operation is a background operation. For example, the read operation can be part of the memory sub-system controller's memory management operations, such as a health status read. Responsive to determining that the read operation is a background operation, the processing logic identifies a second set of read level voltage offsets. The second set of read level voltage offsets, when applied to the base read level voltage associated with the block, result in an error rate below a threshold value. The threshold value can be set to minimize the error rate associated with a read operation performed as a background operation, e.g., a health status read.

In embodiments, the processing logic can assign a special read mode to certain background operation, such as health status reads. When executing the special read mode, the processing logic can determine read offset levels that, when applied to the base read level voltage associated with the block being read, result in the lowest error rate.

At operation 1050, the processing logic computes a modified threshold voltage by applying either the first set or the second set of read level voltage offsets to the base read level voltage associated with the block. The processing logic can apply the second set of read level voltage offsets responsive to determining that the read operation is a background operation, otherwise the processing logic can apply the first set of read level voltage offsets. At operation 1060, the processing logic reads, using the modified threshold voltage, data from the block.

In embodiments, the processing logic can determine a threshold voltage offset bin associated with the identified block, and can associate the first set of read level voltage offsets with the threshold voltage offset bin. The processing logic can associate the first set of read level voltage offset with the threshold voltage offset bin by updating block family metadata associated with the memory device. The block family metadata can include an offset table that associates read level voltage offsets with corresponding threshold voltage offset bins. An example of an offset table is shown in FIG. 7.

In embodiments, the processing logic can identify a physical address of the identified block stored on the memory device. The physical address can include an identifier of the memory device die. The processing logic can identify, based on the block family metadata associated with the memory device, a block family associated with the physical address. The processing logic can identify, based on the block family metadata associated with the memory device, a threshold voltage offset bin associated with the block family. The block family metadata can include a plurality of records, and each record can associate a block with a block family.

FIG. 11 is an example set of read level voltage offsets as determined in accordance with some embodiments of the present disclosure. The bin-offset calibration process determines a set of read level voltage offsets that result in a sub-optimal error rate not exceeding a maximum allowable error rate, thus extending the time period during which a given block family is associated with a particular threshold voltage offset bin. FIG. 11 illustrates an example Set-N 1101 of real level voltage offsets. This example set of read level voltage offsets is for a triple level cell (TLC), and thus has 7 valleys 1105. Note that a set for a single-level cell (SLC) would have 1 valley, a set for a multi-level cell (MLC) would have 3 valleys, a set for a quad-level cell (QLC) would have 15 valleys, and so on. Also in the example illustrated in FIG. 11, the set has 8 bins 1103. The letters a-z represent read level voltage offsets. Note that letters a-z are an example; the read level voltage offsets can be the same in certain valleys and bins, or they can all be different. There can be more or fewer differing read level voltage offsets than illustrated in FIG. 11 (that is, the read level voltage offsets are not limited to the 26 a-z values illustrated in FIG. 11).

In this example, the memory sub-system controller has determined that read level voltage offset a, when applied to valley 1 of a TLC associated with bin-0, results in a suboptimal error rate not exceeding a maximum allowable error rate; read level voltage offset b, when applied to valley 2 of a TLC associated with bin-0, results in a suboptimal error rate not exceeding a maximum allowable error rate; read level voltage offset d, when applied to valley 3 of a TLC associated with bin-0, results in a suboptimal error rate not exceeding a maximum allowable error rate; and so on. Thus, associating a block family with Set-N 1101 can extend the time period during which the block family will be in bin-0, thus reducing the frequency of the calibration process and improving overall system performance.

Figure 12:
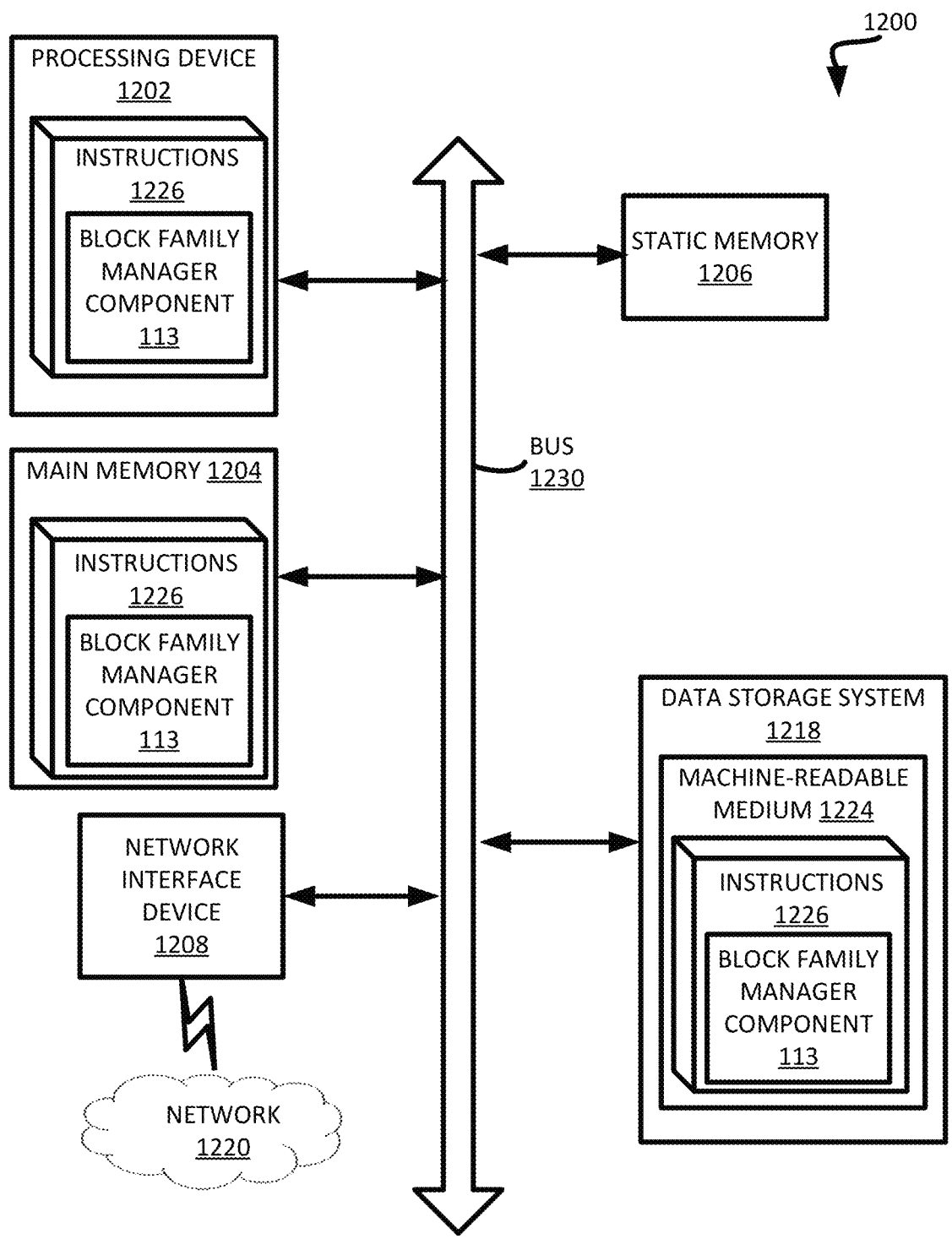
FIG. 12 is a block diagram of an example computer system in which embodiments of the present disclosure may operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or RDRAM, etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium) on which is stored one or more sets of instructions 1226 or software embodying any one or more of the methodologies or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1226 include instructions to implement functionality corresponding to a block family manager component (e.g., the block family manager component 113 of FIG. 1). While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
creating a block family associated with a memory device;
associating the block family with a threshold voltage offset bin;
determining a set of read level voltage offsets such that, when applied to a base read level threshold voltage associated with the block family, result in a suboptimal error rate not exceeding a maximum allowable error rate, wherein the suboptimal error rate exceeds a minimum error rate for the block family; and
associating the set of read level voltage offsets with the threshold voltage offset bin.

2. The method of claim 1, wherein associating the set of read level voltage offsets with the threshold voltage offset bin comprises:
updating block family metadata associated with the memory device, wherein the block family metadata comprises an offset table including a plurality of records, wherein a record of the plurality of records associates sets of read level voltage offsets with corresponding threshold voltage offset bins.

3. The method of claim 2, further comprising:
receiving a read command specifying an identifier of a logical block;
translating the identifier of the logical block into a physical address of a physical block stored on the memory device, wherein the physical address comprises an identifier of a memory device die;
identifying, based on block family metadata associated with the memory device, the block family associated with the physical address;
determining a threshold voltage offset associated with the block family and the memory device die;
computing a modified threshold voltage by applying the threshold voltage offset to a base read level voltage associated with the memory device die; and
reading, using the modified threshold voltage, data from the physical block.

4. The method of claim 1, wherein creating the block family associated with the memory device comprises:
initializing the block family associated with the memory device;
initializing a timeout associated with the block family;
responsive to programming a block residing on the memory device, associating the block with the block family; and
responsive to detecting expiration of the timeout, closing the block family.

5. The method of claim 1, wherein associating the block family with the threshold voltage offset bin comprises:
updating block family metadata associated with the memory device, wherein the block family metadata comprises a table including a plurality of records, and wherein a record of the plurality of records associates a block family with a threshold voltage offset bin.

6. The method of claim 1, wherein determining the set of read level voltage offsets such that, when applied to the base read level threshold voltage associated with the block family, result in the suboptimal error rate not exceeding the maximum allowable error rate comprises:
performing a series of read operations for the block family using a plurality of sets of voltage offsets;
identifying, among the series of read operations, a read operation that results in a bit error rate within a predetermined interval below the maximum allowable bit error rate; and
determining a set of voltage offsets of the plurality of sets of voltage offsets that was used to perform the identified read operation.

7. The method of claim 1, further comprising:
performing a series of calibrations for the threshold voltage offset bin, wherein a time period between two calibrations of the series of calibrations is determined based on a time period during which the block family has been associated with the threshold voltage offset bin.

8. A system comprising:
a memory device; and
a processing device, operatively coupled with the memory device, to perform operations comprising:
identifying a block associated with the memory device;
performing a series of read operations for the block using a plurality of sets of read level voltage offsets; and
identifying a set of read level voltage offsets of the plurality of sets of read level voltage offsets, wherein the set of read level voltage offsets, when applied to a base read level voltage associated with the block, result in a suboptimal error rate not exceeding a maximum allowable error rate, wherein the suboptimal error rate exceeds a minimum error rate for the block.

9. The system of claim 8, further comprising:
determining that a read operation is a background operation;
responsive to determining that the read operation is the background operation, identifying a second set of read level voltage offsets of the plurality of sets of read level voltage offsets, wherein the second set of read level voltage offsets, when applied to the base read level voltage associated with the block, result in a lowest error rate;
computing a modified threshold voltage by applying the second set of read level voltage offsets to the base read level voltage associated with the block; and
reading, using the modified threshold voltage, data from the block.

10. The system of claim 8, further comprising:
determining a threshold voltage offset bin associated with the block;
associating the set of read level voltage offsets with the threshold voltage offset bin by updating block family metadata associated with the memory device, wherein the block family metadata comprises an offset table including a plurality of records, wherein a record of the plurality of records associates sets of read level voltage offsets with corresponding threshold voltage offset bins.

11. The system of claim 10, determining the threshold voltage offset bin associated with the block comprises:
identifying a physical address of the block stored on the memory device, wherein the physical address comprises an identifier of the memory device die;
identifying, based on block family metadata associated with the memory device, a block family associated with the physical address; and
identifying, based on the block family metadata associated with the memory device, a threshold voltage offset bin associated with the block family, wherein the block family metadata comprises a table including a plurality of records, and wherein a record of the plurality of records associates the block with the block family.

12. The system of claim 11, further comprising:
computing a modified threshold voltage by applying the set of read level voltage offsets to the base read level voltage associated with the memory device die; and
reading, using the modified threshold voltage, data from the block.

13. The system of claim 11, further comprising:
performing a series of calibrations for the threshold voltage offset bin, wherein a time period between two calibrations of the series of calibrations is determined based on a time period during which the block family has been associated with the threshold voltage offset bin.

14. A non-transitory computer-readable storage medium comprising instructions that, when executed by a processing device, cause the processing device to perform operations comprising:
creating a block family associated with a memory device;
associating the block family with a threshold voltage offset bin;
determining a set of read level voltage offsets such that, when applied to a base read level threshold voltage associated with the block family, result in a suboptimal error rate not exceeding a maximum allowable error rate, wherein the suboptimal error rate exceeds a minimum error rate for the block family; and
associating the set of read level voltage offsets with the threshold voltage offset bin.

15. The non-transitory computer-readable storage medium of claim 14, wherein associating the set of read level voltage offsets with the threshold voltage offset bin comprises:
updating block family metadata associated with the memory device, wherein the block family metadata comprises an offset table including a plurality of records, wherein a record of the plurality of records associates sets of read level voltage offsets with corresponding threshold voltage offset bins.

16. The non-transitory computer-readable storage medium of claim 15, further comprising:
receiving a read command specifying an identifier of a logical block;
translating the identifier of the logical block into a physical address of a physical block stored on the memory device, wherein the physical address comprises an identifier of a memory device die;
identifying, based on block family metadata associated with the memory device, the block family associated with the physical address;
determining a threshold voltage offset associated with the block family and the memory device die;
computing a modified threshold voltage by applying the threshold voltage offset to a base read level voltage associated with the memory device die; and
reading, using the modified threshold voltage, data from the physical block.

17. The non-transitory computer-readable storage medium of claim 14, wherein creating the block family associated with the memory device comprises:
initializing the block family associated with the memory device;
initializing a timeout associated with the block family;
responsive to programming a block residing on the memory device, associating the block with the block family; and
responsive to detecting expiration of the timeout, closing the block family.

18. The non-transitory computer-readable storage medium of claim 14, wherein associating the block family with the threshold voltage offset bin comprises:

updating block family metadata associated with the memory device, wherein the block family metadata comprises a table including a plurality of records, and wherein a record of the plurality of records associates a block family with a threshold voltage offset bin.

19. The non-transitory computer-readable storage medium of claim 14, wherein determining the set of read level voltage offsets such that, when applied to the base read level threshold voltage associated with the block family, result in the suboptimal error rate not exceeding the maximum allowable error rate comprises:
performing a series of read operations for the block family using a plurality of sets of voltage offsets;
identifying, among the series of read operations, a read operation that results in a bit error rate between a threshold value and the maximum allowable error rate; and
determining a set of voltage offsets of the plurality of sets of voltage offsets that was used to perform the identified read operation.

20. The non-transitory computer-readable storage medium of claim 14, further comprising:
performing a series of calibrations for the threshold voltage offset bin, wherein a time period between two calibrations of the series of calibrations is determined based on a time period during which the block family has been associated with the threshold voltage offset bin.

* * * * *